United States Patent
Kim et al.

(10) Patent No.: US 9,749,126 B2
(45) Date of Patent: Aug. 29, 2017

(54) DATA TRANSMITTER, DATA RECEIVER AND SMART DEVICE USING THE SAME

(71) Applicant: Industry-Academic Cooperation Foundation, Yonsei University, Seoul (KR)

(72) Inventors: Tae Wook Kim, Seoul (KR); Taek Hyun Jung, Seoul (KR); Geun-Haeng Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/980,957

(22) Filed: Dec. 28, 2015

(65) Prior Publication Data

US 2016/0191084 A1 Jun. 30, 2016

(30) Foreign Application Priority Data

Dec. 26, 2014 (KR) ........................ 10-2014-0190622

(51) Int. Cl.
*H04L 7/04* (2006.01)
*H03K 5/15* (2006.01)
*G04F 10/00* (2006.01)

(52) U.S. Cl.
CPC ............. *H04L 7/04* (2013.01); *H03K 5/1502* (2013.01); *H03K 5/15046* (2013.01); *H03K 5/15066* (2013.01); *G04F 10/005* (2013.01)

(58) Field of Classification Search
CPC .... H03K 5/00; H03K 5/1502; H03K 5/15046; H03K 5/15066; G04F 10/005; H04L 7/04
See application file for complete search history.

(56) References Cited

U.S. PATENT DOCUMENTS

2004/0160530 A1* 8/2004 Suzuki ...................... H03L 7/00
  348/536
2008/0111653 A1* 5/2008 Lee ........................ H03K 5/131
  333/24 R

FOREIGN PATENT DOCUMENTS

| JP | 2000-358017 A | 12/2000 |
| JP | 2012-239027 A | 12/2012 |
| KR | 2010-0056108 A | 5/2010 |
| KR | 2010-0130205 A | 12/2010 |

(Continued)

OTHER PUBLICATIONS

Kim et al., "Performance Analysis of Pulse Position Modulation-Time Hopping Ultra Wide Band Systems with Antenna Diversity in Indoor Wireless Channel," Proceedings of ITFE Summer Conference, Aug. 2008, pp. 30-34.

(Continued)

Primary Examiner — Janice Tieu
(74) Attorney, Agent, or Firm — Carter, DeLuca, Farrell & Schmidt, LLP

(57) ABSTRACT

Provided is a data transmitter including a signal interval determination unit configured to receive a data input signal corresponding to data to be transmitted, determine time intervals between a synchronization signal and a plurality of data signals according to the data input signal, and output interval signals corresponding to the intervals; a trigger generation unit configured to trigger according to an output signal from the signal interval determination unit; and a signal generation unit configured to receive the trigger to generate the synchronization signal and the data signals.

8 Claims, 9 Drawing Sheets

(56) References Cited

FOREIGN PATENT DOCUMENTS

| KR | 2012-0113546 A | 10/2012 |
| KR | 2014-0000824 A | 1/2014 |
| KR | 10-1430614 B1 | 8/2014 |

OTHER PUBLICATIONS

Kim, "Impulse Radio UWB Transceiver for Accurate Positioning (within 1cm) and 2-3Gbps class Communication," oral presentation, May 2012, pp. 1-50.

* cited by examiner

DATA TRANSMITTER, DATA RECEIVER AND SMART DEVICE USING THE SAME

CROSS-REFERENCE TO RELATED APPLICATIONS

This U.S. non-provisional patent application claims priority under 35 U.S.C. §119 of Korean Patent Application No. 10-2014-0190622, filed on Dec. 26, 2014, the entire contents of which are hereby incorporated by reference.

BACKGROUND

The present disclosure relates to a data transmitter, a data receiver and a smart device using the same.

A typical wearable device, e.g., smart glass has difficulties in design and use, because a processing module processing data is disposed in glass and thus the power consumption and heat of the smart glass are significant.

In particular, high-definition multimedia content occupies a considerable portion of content handled by a user with the smart device, and when the smart device autonomously processes massive data to provide the data to a user, there are limitations due to power consumption and heat.

SUMMARY

The present disclosure provides a data transmitter, a data receiver and a smart device that may transmit data to a nearby computing device instead of autonomously processing the data by a smart device, and then receive processed data from the computing device to decrease the burden of data processing by the smart device.

The present disclosure also provides a data transmitter, a data receiver, and a smart device that enable high-speed wireless communication at low power.

An embodiment of the inventive concept provides a data transmitter including a signal interval determination unit configured to receive a data input signal corresponding to data to be transmitted, determine time intervals between a synchronization signal and a plurality of data signals according to the data input signal, and output interval signals corresponding to the intervals; a trigger generation unit configured to trigger according to an output signal from the signal interval determination unit; and a signal generation unit configured to receive the trigger to generate the synchronization signal and the data signals.

In an embodiment, the signal interval determination unit may include a first digital-time converter configured to receive a reference signal and a first data input to output, from the reference signal, a first interval signal having an interval that corresponds to the first data input signal; and a second digital-time converter configured to receive the first interval signal and a second data input to output, from the first interval signal, a second interval signal having an interval that corresponds to the second data input signal.

In an embodiment, the signal interval determination unit includes an Nth digital-time converter 111N configured to receive an N−1th interval signal and an Nth data input signal to output, from the N−1th interval signal, an Nth interval signal having an interval that corresponds to the Nth data input signal, where N is a natural number equal to or larger than 3.

In an embodiment, each of the first and second digital-time converters may include a delay line configured by means of a cascade connection of delay cells that delay and output a first input signal by a predetermined delay time; and a signal selector configured to select one of signals output from the delay cells according to a second input signal, wherein the first input signal and the second input signal in the first-time converter may be the reference signal and the first data input signal, respectively and the first input signal and the second input signal in the second digital-time converter may be the first interval signal and the second data input signal, respectively.

In an embodiment, the Nth digital-time converter may include a delay line configured by means of a cascade connection of delay cells that delay and output a first input signal by a predetermined delay time; and a signal selector configured to select one of signals output from the delay cells, wherein the first input signal and the second input signal may be the N−1th interval signal and the Nth data input signal, respectively.

In an embodiment, the trigger generation unit may include an OR gate configured to receive the reference signal, the first interval signal, and the second interval signal to perform OR operation.

In an embodiment, the trigger generation unit may further include a first AND gate configured to receive the reference signal and an inverted reference signal that is obtained by inverting the reference signal, perform AND operation, and output a value to the OR gate, a second AND gate configured to receive the first interval signal and a first inverted interval signal that is obtained by inverting the first interval signal, perform AND operation, and output a value to the OR gate, and a third AND gate configured to receive the second interval signal and a second inverted interval signal that is obtained by inverting the second interval signal, perform AND operation, and output a value to the OR gate.

In an embodiment, the signal generation unit may receive trigger corresponding to the reference signal to generate the synchronization, receive trigger corresponding to the first interval signal to generate a first data signal, and receive trigger corresponding to the second interval signal to generate a second data signal.

In an embodiments of the inventive concept, a data transmitter may include a signal interval determination unit configured to receive a data input signal corresponding to data to be transmitted, determine time intervals between a synchronization signal and a plurality of data signals according to the data input signal, and output interval signals corresponding to the intervals; a signal generation unit configured to configured to generate the synchronization signal and the data signals according to the interval signal.

In an embodiments of the inventive concept, a data receiver may include an analog front end configured to receive a synchronization signal and a plurality of data signals having determined intervals between signals according to data to be transmitted to convert the received signals into digital signals; a pulse classification unit configured to classify a synchronization pulse corresponding to the synchronization signal and each data pulse corresponding to each data signal from the digital signal; and a data conversion unit configured to receive the synchronization pulse and the data pulses to convert intervals between the synchronization pulse and the data pulses into data.

In an embodiment, the analog front end may include a low noise amplifier configured to amplify a reception signal; an envelope detector configured to detect the envelope of the amplified signal; and a comparator configured to compare the envelope with a reference voltage to output a signal according to a result of comparison.

In an embodiment, the pulse classification unit may include a first D flip-flop at which a signal corresponding to a logic level of 1 is input to a data terminal and which receives the digital signal through a clock terminal and outputs the synchronization pulse from a Q terminal; a second D flip-flop at which a signal corresponding to a logic level of 1 is input to a data terminal and which receives the digital signal through a clock terminal and outputs a pulse from a Q terminal; a third D flip-flop that receives a signal output from the Q terminal of the second D flip-flop through a data terminal, receives the digital signal through a clock terminal and outputs a first data pulse from a Q terminal; a fourth D flip-flop at which a signal corresponding to a logic level of 1 is input to a data terminal and which receives the digital signal through a clock terminal and outputs a signal from a Q terminal; a fifth D flip-flop that receives a signal output from the Q terminal of the fourth D flip-flop through a data terminal, receives the digital signal through a clock terminal and outputs a signal from a Q terminal; and a sixth D flip-flop that receives a signal output from the Q terminal of the fifth D flip-flop through a data terminal, receives the digital signal through a clock terminal and outputs a second data pulse from a Q terminal.

In an embodiment, the pulse classification unit may further include N+1 cascade-connected D flip-flops (where N is a natural number equal to or larger than 3), wherein each D flip-flop may receive a signal output from the Q terminal of the D flip-flop in the previous stage through a data terminal and receive the digital signal through a clock terminal, a signal corresponding to a logic level of 1 may be input to the data terminal of the D flip-flop in the first stage, and the D flip-flop in the last stage may output an Nth data pulse from a Q terminal.

In an embodiment, the data conversion unit may include a first time-digital converter configured to output a first digital code corresponding to a time difference between the synchronization pulse and the first data pulse; and a second time-digital converter configured to output a second digital code corresponding to a time difference between the first data pulse and the second data pulse.

In an embodiment, the data conversion unit may further include an Nth time-digital converter configured to output an Nth digital code corresponding to a time difference between an N−1th data pulse and an Nth data pulse, where N may be a natural number equal to or larger than 3.

In an embodiment, each of the first and second time-digital converters may include a delay line configured by the cascade connection of delay cells that delay and output a start signal by a predetermined delay time; and a plurality of phase comparators configured to compare the phase of a start time delayed by the delay cell with the phase of a stop signal to output a digital signal according to the sequence between the delayed start signal and the stop signal, wherein the start signal and the stop signal in the first time-digital converter may be the synchronization pulse and the first data pulse, respectively and the start signal and the stop signal in the second time-digital converter may be the first data pulse and the second data pulse, respectively.

In an embodiment, the Nth digital-time converter may include a delay line configured by means of a cascade connection of delay cells that delay and output a start signal by a predetermined delay time; and a plurality of signal selectors configured to compare the phase of a start time delayed by the delay cell with the phase of a stop signal to output a digital signal according to the sequence between the delayed start signal and the stop signal, wherein the start signal and the stop signal may be the N−1th data pulse and the Nth data pulse, respectively.

In an embodiments of the inventive concept, a smart device includes a transceiver configured to transmit and receive data, wherein the transmission end of the transceiver includes a signal interval determination unit configured to receive a data input signal corresponding to data to be transmitted, determine time intervals between a synchronization signal and a plurality of data signals according to the data input signal, and output interval signals corresponding to the intervals; a trigger generation unit configured to trigger according to an output signal from the signal interval determination unit; and a signal generation unit configured to receive the trigger to generate the synchronization signal and the data signals, and the reception end of the transceiver includes an analog front end configured to receive a synchronization signal and a plurality of data signals having determined intervals between signals according to data to be transmitted to convert the received signals into digital signals; a pulse classification unit configured to classify a synchronization pulse corresponding to the synchronization signal and each data pulse corresponding to each data signal from the digital signal; and a data conversion unit configured to receive the synchronization pulse and the data pulses to convert intervals between the synchronization pulse and the data pulses into data.

In an embodiment, the smart device may include a wearable device that a user may wear.

In an embodiment, the smart device may transmit data to a computing device through the transmission end and receive, from the computing device, processed data obtained by processing the transmitted data through the reception end.

In an embodiment, the computing device may include a smart terminal that a user of the smart device carries.

In an embodiment, the signal interval determination unit may include a first digital-time converter configured to receive a reference signal and a first data input to output, from the reference signal, a first interval signal having an interval that corresponds to the first data input signal; and a second digital-time converter configured to receive the first interval signal and a second data input to output, from the first interval signal, a second interval signal having an interval that corresponds to the second data input signal.

In an embodiment, each of the first and second digital-time converters may include a delay line configured by means of a cascade connection of delay cells that delay and output a first input signal by a predetermined delay time; and a signal selector configured to select one of signals output from the delay cells according to a second input signal, wherein the first input signal and the second input signal in the first-time converter may be the reference signal and the first data input signal, respectively and the first input signal and the second input signal in the second digital-time converter may be the first interval signal and the second data input signal, respectively.

In an embodiment, the pulse classification unit may include a first D flip-flop at which a signal corresponding to a logic level of 1 is input to a data terminal and which receives the digital signal through a clock terminal and outputs the synchronization pulse from a Q terminal; a second D flip-flop at which a signal corresponding to a logic level of 1 is input to a data terminal and which receives the digital signal through a clock terminal and outputs a pulse from a Q terminal; a third D flip-flop that receives a signal output from the Q terminal of the second D flip-flop through a data terminal, receives the digital signal through a clock terminal and outputs a first data pulse from a Q terminal; a fourth D flip-flop at which a signal corresponding to a logic level of 1 is input to a data terminal and which receives the digital signal through a clock terminal and outputs a signal from a Q terminal; a fifth D flip-flop that receives a signal output from the Q terminal of the fourth D flip-flop through a data terminal, receives the digital signal through a clock terminal and outputs a signal from a Q terminal; and a sixth D flip-flop that receives a signal output from the Q terminal of the fifth D flip-flop through a data terminal, receives the digital signal through a clock terminal and outputs a second data pulse from a Q terminal.

In an embodiment, the data conversion unit may include a first time-digital converter configured to output a first digital code corresponding to a time difference between the synchronization pulse and the first data pulse; and a second time-digital converter configured to output a second digital code corresponding to a time difference between the first data pulse and the second data pulse.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Other advantages and features of the inventive concept, and implementation methods thereof will be clarified through following embodiments to be described in detail with reference to the accompanying drawings. The inventive concept may, however, be embodied in different forms and should not be construed as limited to the embodiments set forth herein. Rather, these embodiments are provided so that this disclosure is thorough and complete and fully conveys the scope of the inventive concept to a person skilled in the art to which the inventive concept pertains. Further, the inventive concept is only defined by scopes of claims.

Even if not defined, all the terms used herein (including technology or science terms) have the same meanings as those generally accepted by typical technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

The terms used herein are only for explaining embodiments and not intended to limit the inventive concept. The terms in a singular form in the disclosure also include plural forms unless otherwise specified. The terms used herein "includes", "comprises", "including" and/or "comprising" do not exclude the presence or addition of one or more compositions, ingredients, components, steps, operations and/or elements other than the compositions, ingredients, components, steps, operations and/or elements that are mentioned. In the present disclosure, the term "and/or" indicates each of enumerated components or various combinations thereof.

In the following, embodiments of the inventive concept are described in detail with reference to the accompanying drawings.

Figure 1:
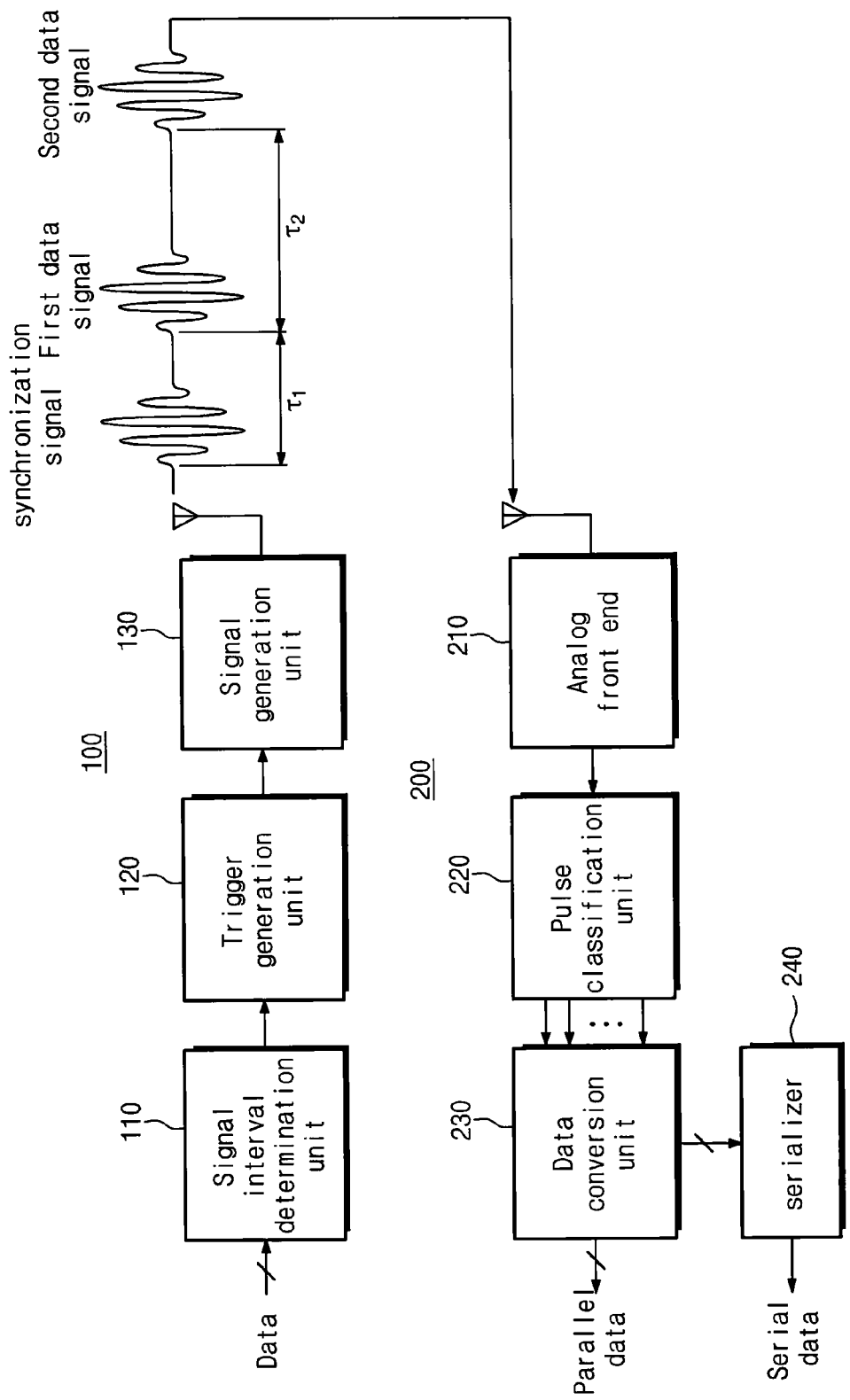
FIG. 1 is an exemplary block diagram of a data transmitter and a data receiver according to an embodiment of the inventive concept.

FIG. 1 is an exemplary block diagram of a data transmitter 100 and a data receiver 200 according to an embodiment of the inventive concept.

As shown in FIG. 1, the data transmitter 100 and the data receiver 200 may wirelessly communicate by using impulses.

In an embodiment of the inventive concept, it is possible to modulate and transmit data into time intervals between impulse signals and demodulate the received time intervals between the impulse signals into the data to wirelessly send and receive data between the transmitter 100 and the receiver 200.

In an embodiment of the inventive concept, signals that are sent and received between the transmitter 100 and the receiver 200 include synchronization signals and data signals, and a single synchronization signal and a plurality of data signals are included in a single transceiving section so that data may be delivered at time intervals $\tau 1, \tau 2, \ldots \tau n$ between them.

According to an embodiment of the inventive concept, the data transmitter 100 may include a signal interval determination unit 110, a trigger generation unit 120, and a signal generation unit 130, and the data receiver 200 may include an analog front end 210, a pulse classification unit 220, and a data conversion unit 230.

According to an embodiment, the data receiver 200 may further include a serializer 240 to convert parallel data output by the data conversion unit 230 into serial data.

In the following, the detailed structure and operation of the data transmitter 100 according to an embodiment of the inventive concept are described with reference to FIGS. 2 to 4.

Figure 2:
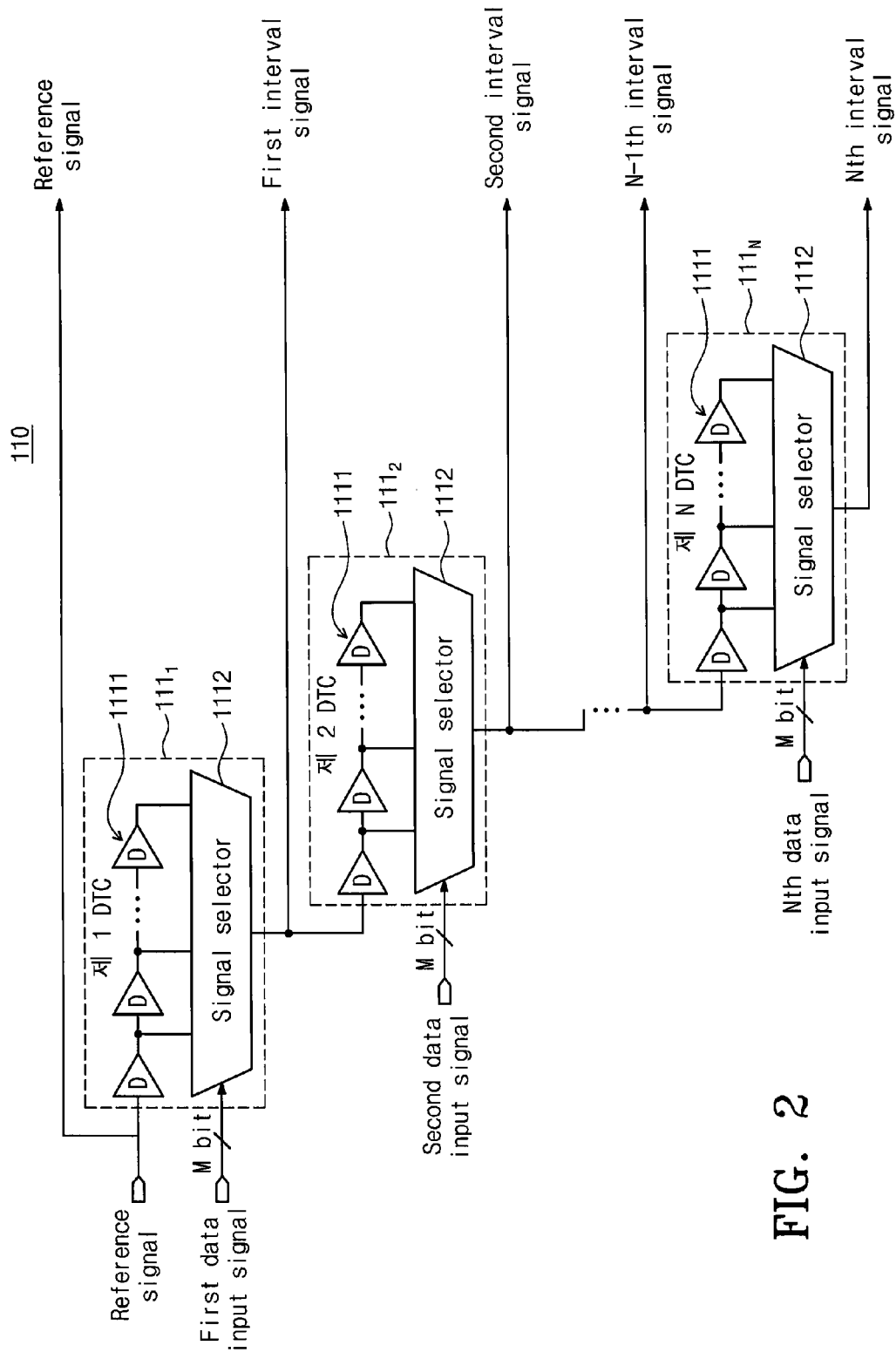
FIG. 2 is an exemplary circuit diagram of a signal interval determination unit according to an embodiment of the inventive concept.

FIG. 2 is an exemplary circuit diagram of the signal interval determination unit 110 according to an embodiment of the inventive concept.

As shown in FIG. 2, the signal interval determination unit 110 may include a plurality of digital-time converters $111_1$ to $111_N$. The digital-time converter may receive first and second input signals to delay and output the first input signal according to the second input signal so that it is possible to convert digital information on the second input signal into a time difference between the first input signal and the first input signal delayed.

According to an embodiment of the inventive concept, the signal interval determination unit 110 may include a first digital-time converter 111₁ and a second digital-time converter 111₂.

The first digital-time converter 111₁ may receive a reference signal and a first data input signal to output, from the reference signal, a first interval signal having an interval that corresponds to the first data input signal. The second digital-time converter 111₂ may receive the first interval signal and a second data input signal to output, from the first interval signal, a second interval signal having an interval that corresponds to the second data input signal.

In other words, the first digital-time converter 111₁ may delay the reference signal according to the first data input signal to output the first interval signal and the second digital-time converter 111₂ may delay the first interval signal output by the first digital-time converter 111₁ according to the second data input signal to output the second interval signal.

According to an embodiment, the signal interval determination unit 110 may also have three or more digital-time converters. In this case, the signal interval determination unit 110 may include an Nth digital-time converter 111_N that receives an N−1th interval signal and an Nth data input signal to output, from the N−1th interval signal, an Nth interval signal having an interval that corresponds to the Nth data input signal. In this case, N is a natural number equal to or larger than 3.

Referring to FIG. 2, each of the first and second digital-time converters may include a delay line 1111 and a signal selector 1112. The delay line 1111 may be configured by the cascade connection of delay cells that delay and output the first input signal by a predetermined delay time D. The signal selector 1112 may select one of signals that the delay cells output according to the second input signal.

According such a structure, the first input and the second input signal in the first digital-time converter 111₁ may be the reference signal and the first data input signal, respectively and the first input signal and the second input signal in the second digital-time converter 111₂ may be the first interval signal and the second data input signal, respectively.

Likewise, the first input signal and the second input signal in the Nth digital-time converter 111_N may be the N−1th interval signal and the Nth data input signal, respectively.

According to an embodiment, the reference signal may be the clock signal of the data transmitter 100 but is not limited thereto.

According to an embodiment, the signal selector 1112 may include a multiplexer, which may select and output any one of a plurality of signals received the delay line 1111 according to a data input signal.

In addition, although FIG. 2 shows that the data input signal is M bit, each data input signal according to an embodiment does not necessarily have the same bit length and may also have different bit lengths.

As such, the signal interval determination unit 110 may include two ore more digital-time converters 111₁ to 111_N to output signals (i.e., a reference signal and one or more interval signals) for determining intervals between a synchronization and a plurality of data signals according to data to be transmitted (i.e., first to Nth data input signals).

The trigger generation unit 120 may generate trigger according to an output signal from the signal interval determination unit 110.

Figure 3:
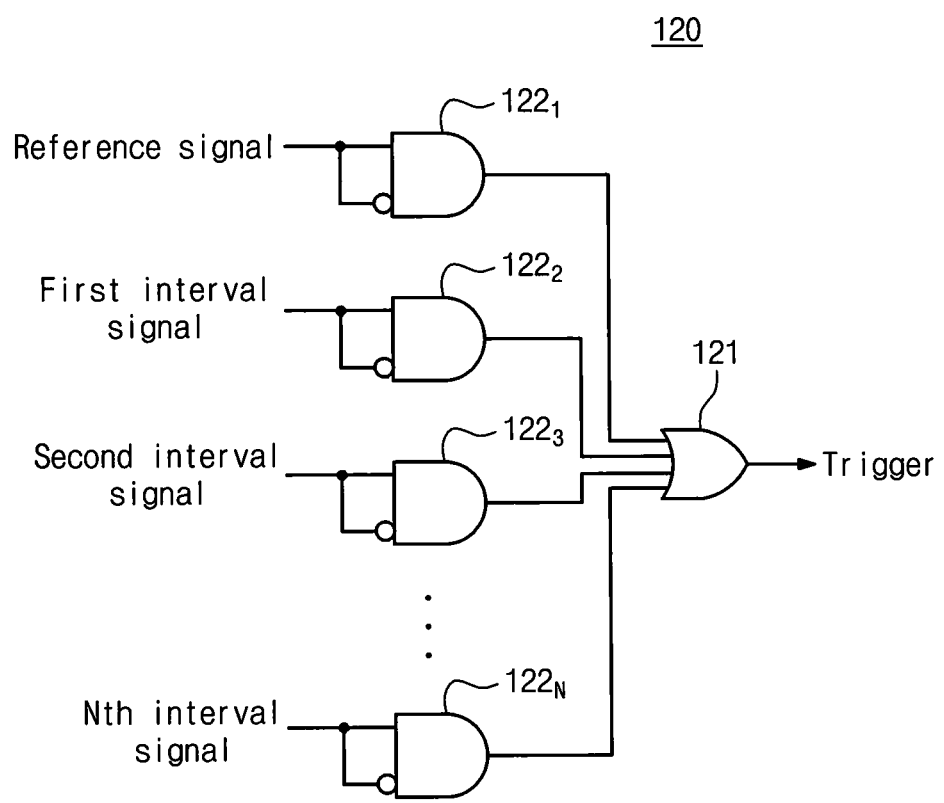
FIG. 3 is an exemplary circuit diagram of a trigger generation unit according to an embodiment of the inventive concept.

FIG. 3 is an exemplary circuit diagram of the trigger generation unit 120 according to an embodiment of the inventive concept.

As shown in FIG. 3, the trigger generation unit 120 may include an OR gate 121. The OR gate 121 may receive a reference signal, a first interval signal, a second interval signal, . . . , and an Nth interval signal that are output from the signal interval determination unit 110, and calculate OR operation.

Furthermore, the trigger generation unit 120 may further include a first AND gate 1221 that receives the reference signal and an inverted reference signal that is obtained by inverting the reference signal, performs AND operation, and outputs a value to the OR gate 121, a second AND gate 1222 that receives the first interval signal and a first inverted interval signal that is obtained by inverting the first interval signal, performs AND operation, and outputs a value to the OR gate 121, and a third AND gate 1223 that receives the second interval signal and a second inverted interval signal that is obtained by inverting the second interval signal, performs AND operation and outputs a value to the OR gate 121.

According to an embodiment, when three or more interval signals are output from the signal interval determination unit 110, the trigger generation unit 120 may further include AND gates corresponding to the interval signals.

The signal generation unit 130 may receive trigger from the trigger generation unit 120 to generate a synchronization signal and data signals.

According to an embodiment, the signal generation unit 130 may include a pulse generation circuit that receives the trigger and generates a pulse that has a predetermined pulse width. The signals generated by the signal generation unit 130 may be transmitted to the data receiver 200 through an antenna.

Figure 4:
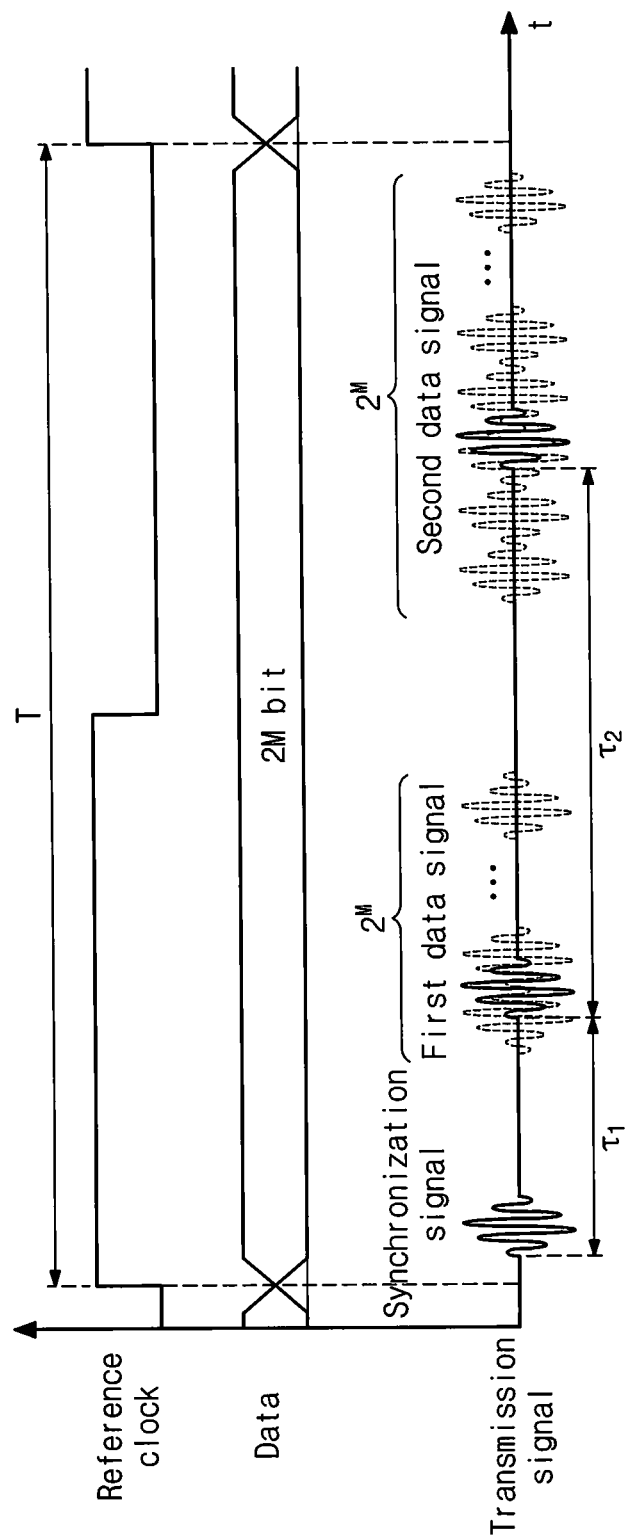
FIG. 4 is an exemplary timing diagram for explaining signals transmitted by a data transmitter according to an embodiment of the inventive concept.

FIG. 4 is an exemplary timing diagram for explaining signals transmitted by the data transmitter 100 according to an embodiment of the inventive concept.

Referring to FIG. 4, the data transmitter 100 may transmit a synchronization signal and a plurality of data signals within a reference clock period T. The intervals $\tau 1, \tau 2, \ldots \tau n$ between the synchronization and the data signals are determined according to data that the data transmitter 100 transmits.

For example, when as shown in FIG. 2, each data input signal is M bit, a time interval $\tau 1$ between a synchronization signal and a first data signal is determined according to the bit value of a first data input signal and a time interval $\tau 2$ between the first data signal and a second data signal may be determined according to the bit value of a second data input signal. In this way, a time interval $\tau N$ between an N−1th data signal and an Nth data signal may be determined according to the bit value of an Nth data input signal.

As such, since the time interval $\tau$ between the data signal and a previous signal is determined according to an M bit binary data input signal, positions that the data signal may have are a total of $2^M$ positions.

Since as described earlier, the data transmitter 100 determines the time intervals $\tau 1, \tau 2, \ldots \tau n$ between a synchronization signal and two or more (e.g., N−1) data signals according to data that the data transmitter 100 transmits, and transmits the determined time intervals to the data receiver 200, the data transmitter may transmit N×M bit data per reference clock.

Subsequent to the data transmitter 100, the detailed structure and operation of the data receiver 200 according to an embodiment of the inventive concept are described with reference to FIGS. 5 to 9.

As shown in FIG. 1, the data receiver 200 may include an analog front end 210, a pulse classification unit 220, and a data conversion unit 230.

The analog front end 210 may receive a synchronization signal and a plurality of data signals from the data transmitter 100 to convert the received signals into digital signals.

Figure 5:
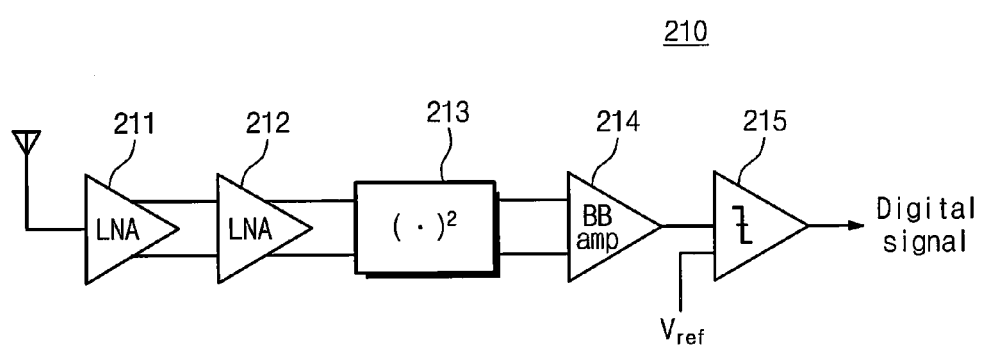
FIG. 5 is an exemplary circuit diagram of an analog front end according to an embodiment of the inventive concept.

FIG. 5 is an exemplary circuit diagram of the analog front end 210 according to an embodiment of the inventive concept.

As shown in FIG. 5, according to an embodiment of the inventive concept, the analog front end 210 may include low nose amplifiers 211 and 212 that amplify a reception signal, an envelope detector 213 that detects the envelope of the amplified signal, and a comparator 215 that compares the envelope with a reference voltage to output a signal according to a result of comparison.

According to an embodiment, the low noise amplifiers may include a first low noise amplifier 211 that amplifies a signal received by an antenna to output the amplified signal as a differential signal, and a second low noise amplifier 212 that differentially amplifies the differential signal, but the configuration of the low noise amplifiers are not limited thereto.

The envelope detector 213 may output the square of a signal in order to detect the envelope of the amplified signal, but a method of detecting the envelope is not limited thereto.

According to an embodiment, a baseband amplifier 214 may be further included between the envelope detector 213 and the comparator 215, as shown in FIG. 5.

The comparator 215 may compare the envelope of a reception signal with a reference voltage of Vref, output a signal corresponding to a logic level of 1 when the envelope is equal to or higher than the reference voltage of Vref and output a signal corresponding to a logic level of 0 when the envelope is lower than the reference voltage of Vref, and convert the reception signal into a digital signal.

The pulse classification unit 220 may classify a synchronization pulse corresponding to the synchronization signal and each data pulse corresponding to each data signal from the digital signal.

Figure 6:
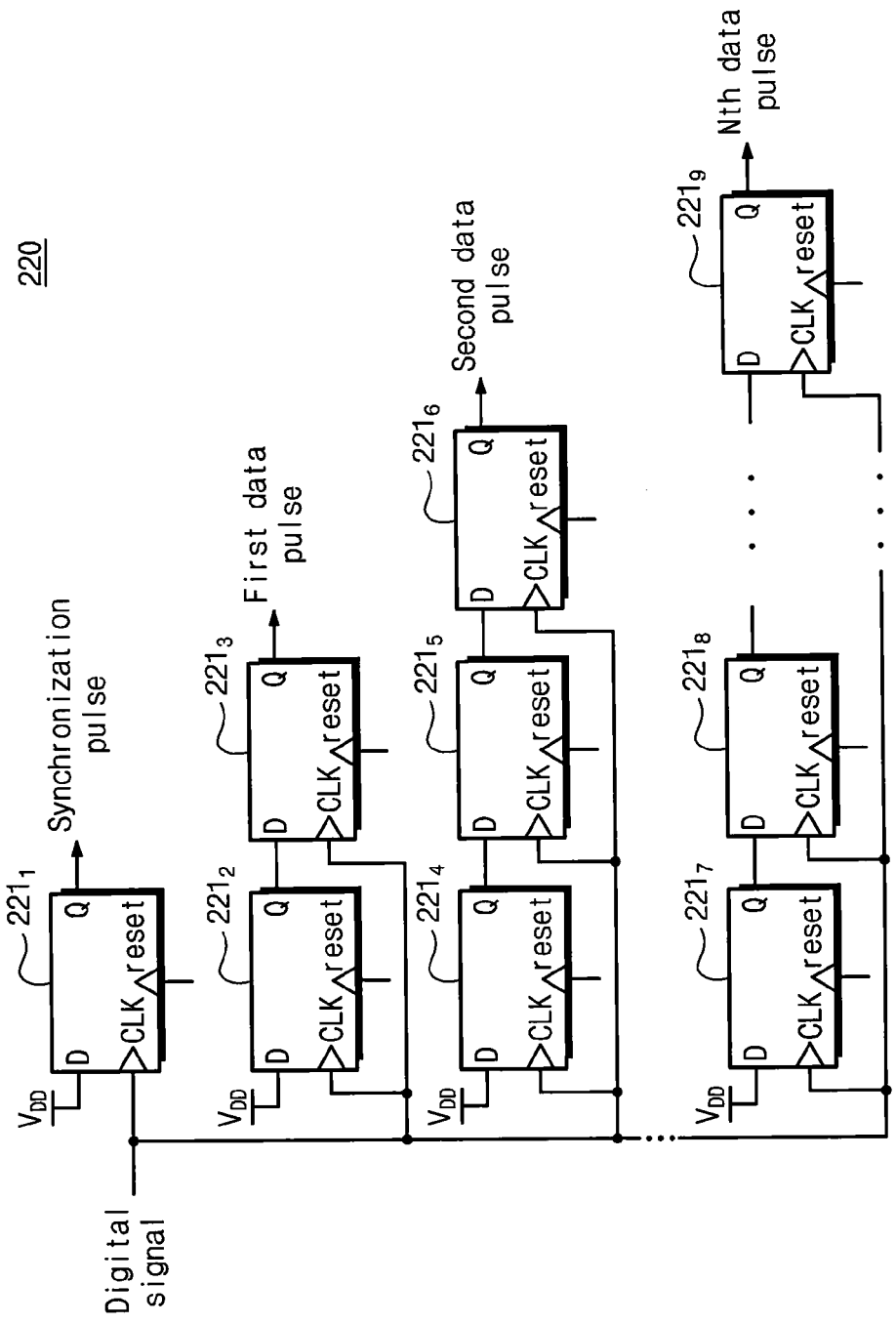
FIG. 6 is an exemplary circuit diagram of a pulse classification unit according to an embodiment of the inventive concept.

FIG. 6 is an exemplary circuit diagram of the pulse classification unit 220 according to an embodiment of the inventive concept.

The pulse classification unit 220 may use a plurality of D flip-flops to classify the synchronization pulse and data pulses from the digital signal.

For example, the pulse classification unit 220 may classify a synchronization signal and first and second data pulses from the digital signal through six D flip-flops as shown in FIG. 6.

In particular, the pulse classification unit 220 may include a first D flip flop $221_1$ at which a signal VDD corresponding to a logic level of 1 is input to a data terminal D and which receives the digital signal through a clock terminal CLK and outputs a synchronization pulse from a Q terminal.

Also, the pulse classification unit 220 may include a second D flip-flop $221_2$ at which a signal VDD corresponding to a logic level of 1 is input to a data terminal D and which receives the digital signal through a clock terminal CLK and outputs a signal from a Q terminal, and a third D flip-flop $221_3$ that receives a signal output from the Q terminal of the second D flip-flop $221_2$ through a data terminal D, receives the digital signal through a clock terminal CLK and outputs a first data pulse from a Q terminal.

Also, the pulse classification unit 220 may include a fourth D flip-flop $221_4$ at which a signal VDD corresponding to a logic level of 1 is input to a data terminal D and which receives the digital signal through a clock terminal CLK and outputs a signal from a Q terminal, a fifth D flip-flop $221_5$ that receives a signal output from the Q terminal of the fourth D flip-flop $221_4$ through a data terminal D, receives the digital signal through a clock terminal CLK and outputs a signal from a Q terminal, and a sixth D flip-flop $221_6$ that receives a signal output from the Q terminal of the fifth D flip-flop $221_5$ through a data terminal D, receives the digital signal through a clock terminal CLK and outputs a second data pulse from a Q terminal.

In this way, the pulse classification unit 220 may include N+1 cascade-connected D flip-flops in order to classify a Nth data pulse corresponding to an Nth data signal from the digital signal. In this case, each D flip-flop may receive a signal output from the Q terminal of the D flip-flop in the previous stage through a data terminal D and receive the digital signal through a clock terminal CLK. For a D flip-flop $221_7$ in the first stage, a signal VDD corresponding to a logic level of 1 may be input to a data terminal D and a D flip-flop $221_9$ in the last stage may output an Nth data pulse from a Q terminal.

In order for the pulse classification unit 220 to classify a synchronization pulse and data signals from the digital signal as described earlier, the D flip flops may be reset by a pulse that has a period corresponding to the reference pulse of the data transmitter 100 as shown in FIG. 4. As a result, a signal input as a digital signal for the first time after the resetting of the D flip-flops corresponds to a synchronization signal, a signal input next time corresponds to a first data signal, and an N+1th input signal may correspond to an Nth data signal.

The data conversion unit 230 may receive a synchronization pulse and data pulses to convert them into data.

Figure 7:
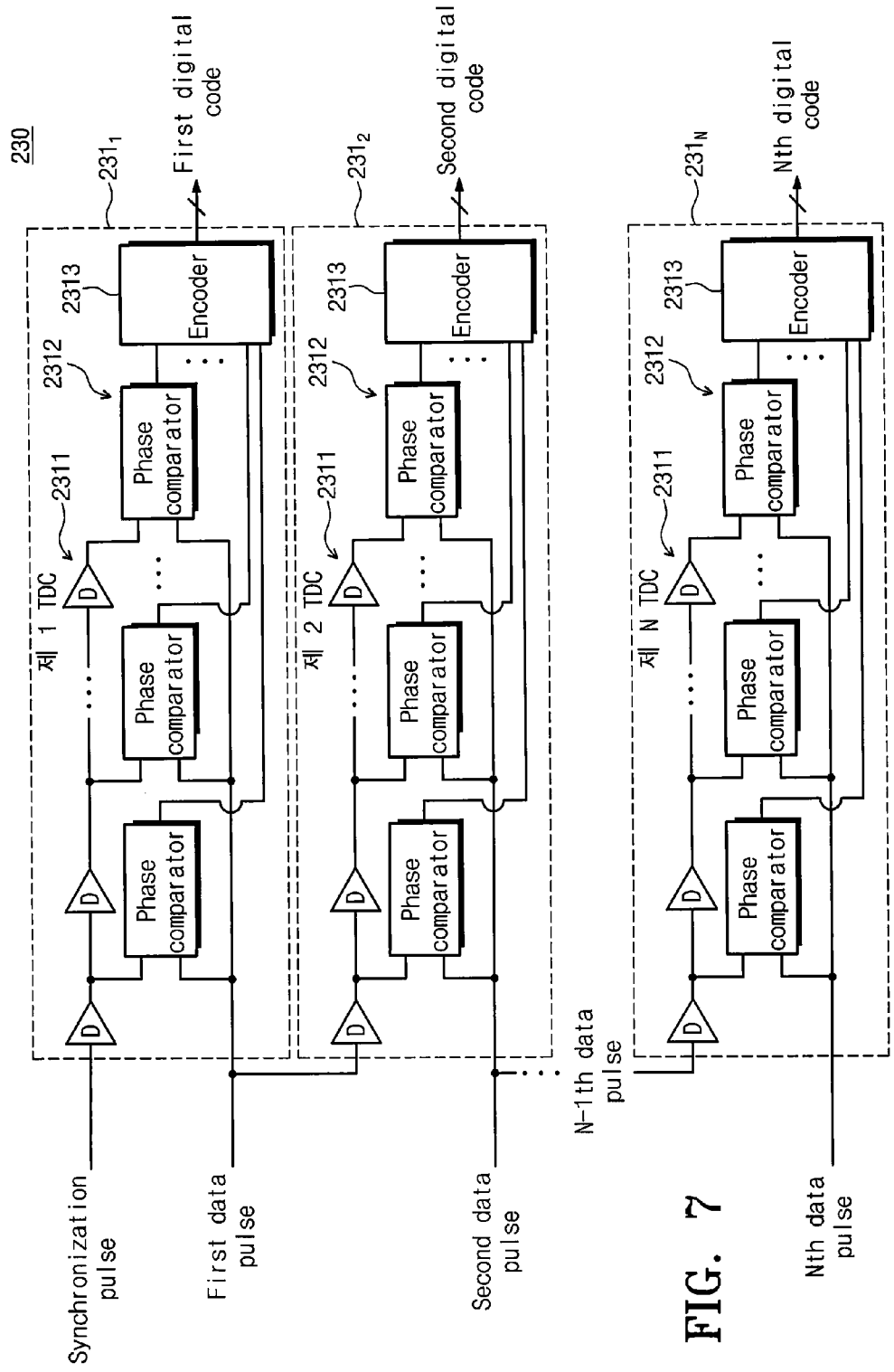
FIG. 7 is an exemplary circuit diagram of a data conversion unit according to an embodiment of the inventive concept.

FIG. 7 is an exemplary circuit diagram of the data conversion unit 230 according to an embodiment of the inventive concept.

As shown in FIG. 7, the data conversion unit 230 may include a plurality of time-digital converters 2311 to 231N. The time-digital converter may receive a start signal and a stop signal and output a digital code corresponding to a time difference between two signals.

According to an embodiment of the inventive concept, the data conversion unit 230 may include a first time-digital converter 2311 and a second time-digital converter 2312. The first time-digital converter 2311 may output a first digital code that corresponds to a time difference between a synchronization pulse and a first data pulse. The second time-digital converter 2312 may output a second digital code that corresponds to a time difference between the first data pulse and a second data pulse.

According to an embodiment, the data conversion unit 230 may also have three or more time-digital converters. In this case, the data conversion unit 230 may include an Nth time-digital converter $231_N$ that outputs an Nth digital code corresponding to a time difference between an N−1th data pulse and an Nth data pulse. In this case, N is a natural number equal to or larger than 3.

Referring to FIG. 7, each of the first and second time-digital converters may include a delay line 2311 and a plurality of phase comparators 2312. The delay line 2311 may be configured by the cascade connection of delay cells that delay and output a start signal by a predetermined delay time D. The phase comparator 2312 may compare the phase of a start time delayed by the delay cell with the phase of a stop signal to output a digital signal according to the sequence between the delayed start signal and the stop signal.

According to an embodiment, the time-digital converter may further include an encoder 2313 that converts thermometer codes output by the phase comparators 2312 into binary codes.

According to such a structure, the start signal and the stop signal in the first time-digital converter $231_1$ are a synchronization pulse and a first data pulse, respectively and the start signal and the stop signal in the second time-digital converter $231_2$ may be the first data pulse and a second data pulse, respectively.

Likewise, the start signal and the stop signal in the Nth time-digital converter $231_N$ may be an N−1th data pulse and an Nth data pulse, respectively.

As such, the data conversion unit 230 may include two or more time-digital converters $231_1$ to $231_N$ to convert time intervals between the synchronization pulse and data pulses into data.

Since as described earlier, the synchronization pulse corresponds to the synchronization signal among reception signals and the data pulse corresponds to the data signal, time intervals between the synchronization pulse and the data pulses correspond to time intervals $\tau 1, \tau 2, \ldots \tau n$ between the synchronization signal and the data signals transmitted by the data transmitter 100.

As a result, the data receiver 200 may demodulate the synchronization signal and data signals received from the data transmitter 100 to obtain the data transmitted by the data transmitter 100.

Figure 8:
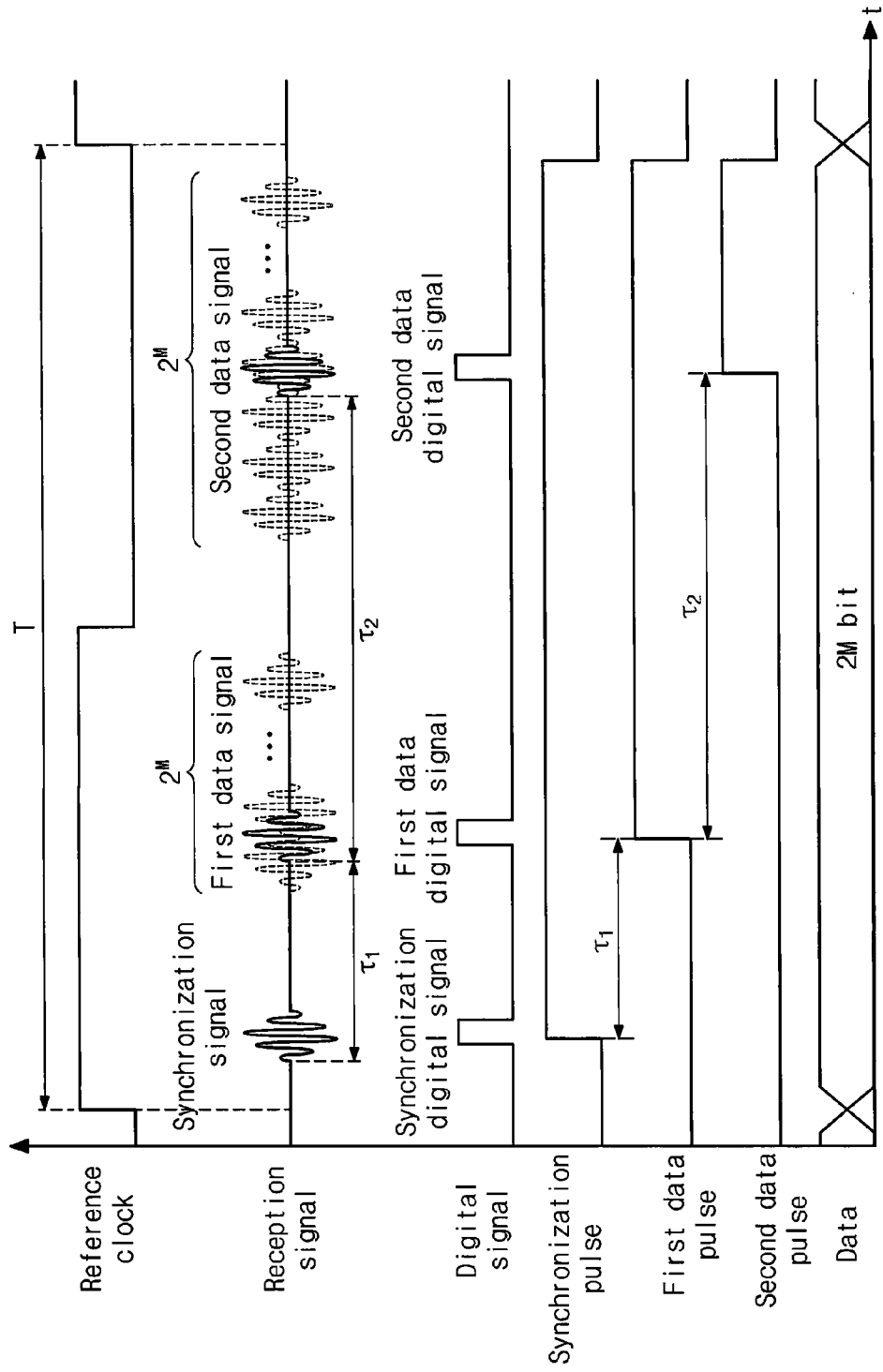
FIG. 8 is an exemplary timing diagram for explaining the process of obtaining data from a reception signal by a data receiver according to an embodiment of the inventive concept.

FIG. 8 is an exemplary timing diagram for explaining the process of obtaining data from a reception signal by the data receiver 200 according to an embodiment of the inventive concept.

Referring to FIG. 8, the data transmitter 200 may transmit a synchronization signal and a plurality of data signals within a reference clock period T. As described earlier with reference to FIG. 4, the intervals $\tau 1, \tau 2, \ldots$ in between the synchronization signal and the data signals are secured according to data to be transmitted.

The data receiver 200 may process a reception signal through the analog front end 210 to obtain a digital signal corresponding to the reception signal.

Then, the data receiver 200 may classify the synchronization pulse and the data pulses from the digital signal through the pulse classification unit 220. As shown in FIG. 8, the rising edges of the synchronization pulse and the data pulses may correspond to the rising edges of a synchronization digital signal and data digital signals, respectively.

As a result, the time difference $\tau 1$ between the synchronization pulse and a first data pulse may correspond to the time interval $\tau 1$ between the synchronization signal and the first data signal and the time difference $\tau 2$ between the first data pulse and the second data pulse may correspond to the time interval $\tau 2$ between the first data signal and the second data signal.

Finally, the data receiver 200 may obtain a digital code corresponding to the time differences $\tau 1, \tau 2, \ldots$ to between the synchronization pulse and the data pulses to demodulate the data transmitted by the data transmitter 100.

Also, the data receiver 200 may reset D flip-flops when or before a new reference clock starts at the pulse classifier 220, and enable the synchronization pulse and the data pulses to become a logic level of zero.

The embodiment of the inventive concept may use the above-described data transmitter 100 and data receiver 200 to implement high-speed wireless communication at low power. According to an embodiment, the data transmitter 100 and the data receiver 200 may be disposed in a smart device, such as a smart phone or smart gear to implement a cloud computing environment with a separate computing device.

Figure 9:
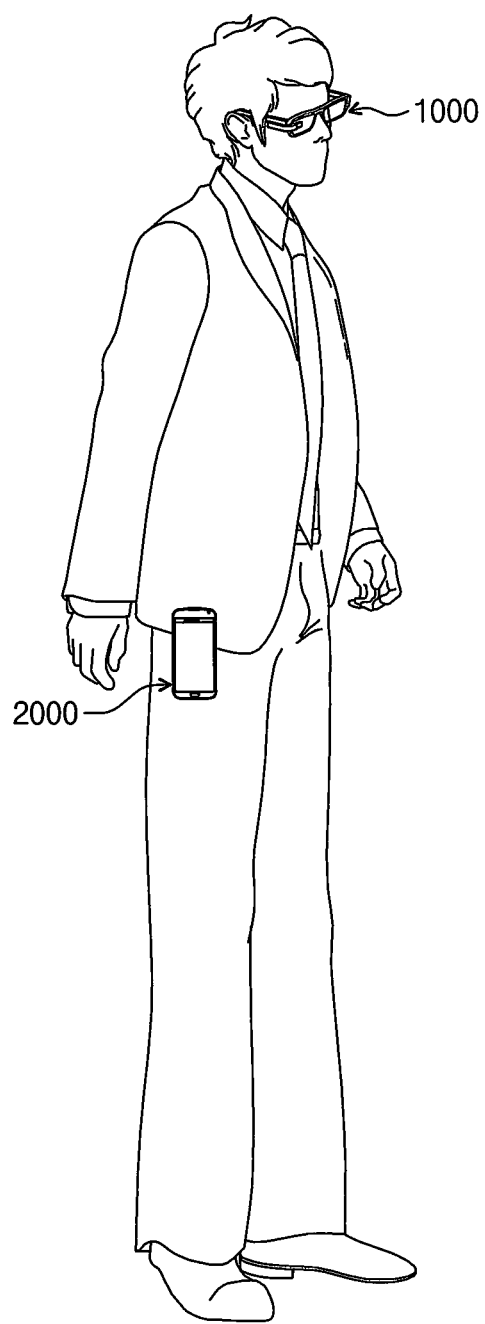
FIG. 9 is an exemplary diagram that represents how a smart device sends and receives data to and from a computing device.

FIG. 9 is an exemplary diagram that represents how a smart device 1000 sends and receives data to and from a computing device 2000.

As shown in FIG. 9, the smart device 1000 may send and receive data through short-range communication with a separate computing device 2000. In the short-range data communication, the data transmitter 100 and data transmitter 200 according to an embodiment of the inventive concept as described above may be used as short-range communication modules.

According to an embodiment, the smart device 1000 may transmit data to the computing device 2000 through a transmission end (i.e., data communication device 100), and the computing device 2000 may process the received data to transmit the processed data back to the smart device 1000.

As a result, the smart device 1000 may enable another computing device 2000 to process data instead of autonomously processing and storing or providing the data to a user as before so that it is possible to decrease the burden of data processing on a device and reduce power consumption and heat.

In the embodiment, the smart device 1000 may be a wearable device that a user may wear, and the computing device 2000 may include a smart terminal that the user carries, such as a smart phone, tablet PC, or the like but the types of the smart device and the computing device are not limited thereto.

According to an embodiment of the inventive concept, it is possible to decrease the burden of data processing on the smart device and reduce the power consumption and heat of the device.

According to an embodiment of the inventive concept, it is possible to perform high-speed wireless communication at low power.

Although the inventive concept is described above through embodiments, the embodiments above are only provided to describe the spirit of the inventive concept and not intended to limit the inventive concept. A person skilled in the art would understand that various modifications to the above-described embodiments may be implemented. The scope of the inventive concept is defined only by the following claims.

What is claimed is:

1. A data transmitter comprising:
   a memory configured to store computer-readable instructions; and
   one or more processors configured to execute the computer-readable instructions to cause the data transmitter to:
   receive a data input signal corresponding to data to be transmitted;
   determine time intervals, according to the data input signal, between a synchronization signal to be generated and a plurality of data signals to be generated;
   output interval signals corresponding to the time intervals;
   trigger according to the output interval signals; and
   receive the trigger to generate the synchronization signal and the plurality of data signals.

2. The data transmitter of claim 1, wherein the one or more processors execute the computer-readable instructions to further cause the data transmitter to:
receive a reference signal and a first data input signal to output, from the reference signal, a first interval signal having an interval that corresponds to the first data input signal; and
receive the first interval signal and a second data input signal to output, from the first interval signal, a second interval signal having an interval that corresponds to the second data input signal.

3. The data transmitter of claim 2, wherein the one or more processors execute the computer-readable instructions to further cause the data transmitter to receive an N−1th interval signal and an Nth data input signal to output, from the N−1th interval signal, an Nth interval signal having an interval that corresponds to the Nth data input signal, where N is a natural number larger than or equal to 3.

4. The data transmitter of claim 2, wherein the one or more processors execute the computer-readable instructions to further cause the data transmitter to:
delay and output a first input signal by a predetermined delay time by a cascade connection of delay cells; and
select one of signals outputted from the delay cells according to a second input signal,
wherein the first input signal and the second input signal are the reference signal and the first data input signal, respectively, and the first input signal and the second input signal are the first interval signal and the second data input signal, respectively.

5. The data transmitter of claim 3, wherein the one or more processors execute the computer-readable instructions to further cause the data transmitter to:
delay and output a first input signal by a predetermined delay time by a cascade connection of delay cells; and
select one of signals outputted from the delay cells, wherein the first input signal and a second input signal is the N−1th interval signal and the Nth data input signal, respectively.

6. The data transmitter of claim 2, wherein the one or more processors execute the computer-readable instructions to further cause the data transmitter to receive the reference signal, the first interval signal, and the second interval signal to perform an OR operation.

7. The data transmitter of claim 6, wherein the one or more processors execute the computer-readable instructions to further cause the data transmitter to:
receive the reference signal and an inverted reference signal that is obtained by inverting the reference signal, perform an AND operation, and output a value to the OR operation;
receive the first interval signal and a first inverted interval signal that is obtained by inverting the first interval signal, perform an AND operation, and output a value to the OR operation; and
receive the second interval signal and a second inverted interval signal that is obtained by inverting the second interval signal, perform an AND operation, and output a value to the OR operation.

8. The data transmitter of claim 6, wherein the one or more processors execute the computer-readable instructions to further cause the data transmitter to:
receive a trigger corresponding to the reference signal to generate the synchronization signal;
receive a trigger corresponding to the first interval signal to generate a first data signal; and
receive a trigger corresponding to the second interval signal to generate a second data signal.

* * * * *